US010340380B2

(12) United States Patent
Flachowsky et al.

(10) Patent No.: US 10,340,380 B2
(45) Date of Patent: Jul. 2, 2019

(54) THREE-DIMENSIONAL TRANSISTOR WITH IMPROVED CHANNEL MOBILITY

(71) Applicant: GLOBALFOUNDRIES Inc., Grand Cayman (KY)

(72) Inventors: Stefan Flachowsky, Dresden (DE); Jan Hoentschel, Dresden (DE); Ralf Richter, Radebeul (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 394 days.

(21) Appl. No.: 15/161,399

(22) Filed: May 23, 2016

(65) Prior Publication Data

US 2016/0268426 A1 Sep. 15, 2016

Related U.S. Application Data

(62) Division of application No. 14/052,977, filed on Oct. 14, 2013, now Pat. No. 9,373,720.

(51) Int. Cl.
*H01L 27/088* (2006.01)
*H01L 29/78* (2006.01)
(Continued)

(52) U.S. Cl.
CPC .. *H01L 29/7843* (2013.01); *H01L 21/823412* (2013.01); *H01L 21/823431* (2013.01);
(Continued)

(58) Field of Classification Search
CPC ............ H01L 29/7843; H01L 29/161; H01L 27/0886; H01L 21/823431; H01L 21/823412; H01L 29/785; H01L 29/66795
(Continued)

(56) References Cited

U.S. PATENT DOCUMENTS 7,105,390 B2 9/2006 Brask et al.
8,399,931 B2 3/2013 Liaw et al.
(Continued)

FOREIGN PATENT DOCUMENTS

CN 102315213 A 1/2012
TW 200601418 A 1/2006

OTHER PUBLICATIONS

Official Action from Chinese Patent Application No. 201410541490.6 dated Jan. 3, 2017.
(Continued)

*Primary Examiner* — Anthony Ho
*Assistant Examiner* — Mohammad M Hoque
(74) *Attorney, Agent, or Firm* — Amerson Law Firm, PLLC (57) ABSTRACT

A semiconductor device includes a plurality of spaced apart fins, a dielectric material layer positioned between each of the plurality of spaced apart fins, and a common gate structure positioned above the dielectric material layer and extending across the fins. A continuous merged semiconductor material region is positioned on each of the fins and above the dielectric material layer, is laterally spaced apart from the common gate structure, extends between and physically contacts the fins, has a first sidewall surface that faces toward the common gate structure, and has a second sidewall surface that is opposite of the first sidewall surface and faces away from the common gate structure. A stress-inducing material is positioned in a space defined by at least the first sidewall surface, opposing sidewall surfaces of an adjacent pair of fins, and an upper surface of the dielectric material layer.

20 Claims, 7 Drawing Sheets

(51) Int. Cl.
  *H01L 29/66*  (2006.01)
  *H01L 21/8234*  (2006.01)
  *H01L 29/161*  (2006.01)

(52) U.S. Cl.
  CPC ........ *H01L 27/0886* (2013.01); *H01L 29/161* (2013.01); *H01L 29/66795* (2013.01); *H01L 29/785* (2013.01)

(58) Field of Classification Search
  USPC .......................................................... 257/401
  See application file for complete search history.

(56) References Cited

U.S. PATENT DOCUMENTS

| | | | |
|---|---|---|---|
| 8,445,334 | B1 | 5/2013 | Basker et al. |
| 8,669,145 | B2 | 3/2014 | Doris et al. |
| 8,729,634 | B2 | 5/2014 | Shen et al. |
| 2006/0014338 | A1 | 1/2006 | Doris et al. |
| 2006/0261411 | A1 | 11/2006 | Hareland et al. |
| 2009/0101978 | A1 | 4/2009 | Anderson et al. |
| 2010/0117156 | A1 | 5/2010 | Tsutsui et al. |
| 2011/0193141 | A1 | 8/2011 | Lin et al. |
| 2012/0132989 | A1 | 5/2012 | Haensch et al. |
| 2012/0146114 | A1 | 6/2012 | Nakabayashi et al. |
| 2013/0056827 | A1 | 3/2013 | Tsai et al. |
| 2013/0134506 | A1 | 5/2013 | Yagishita |
| 2013/0200468 | A1 | 8/2013 | Cai et al. |
| 2013/0200470 | A1 | 8/2013 | Liu et al. |
| 2013/0334606 | A1* | 12/2013 | Shen ................. H01L 29/66818 257/368 |
| 2014/0134814 | A1 | 5/2014 | Wong et al. |
| 2014/0151761 | A1* | 6/2014 | Hsieh ................ H01L 29/66545 257/288 |
| 2014/0239395 | A1 | 8/2014 | Basker et al. |
| 2014/0264598 | A1 | 9/2014 | Cheng et al. |
| 2015/0041908 | A1 | 2/2015 | Adam et al. |
| 2015/0102426 | A1 | 4/2015 | Flachowsky et al. |

OTHER PUBLICATIONS

Official Action from Chinese Patent Application No. 201410541490.6 dated Sep. 5, 2017.

Official Action from Taiwanese Patent Application No. 103135468 dated Dec. 12, 2016.

* cited by examiner

THREE-DIMENSIONAL TRANSISTOR WITH IMPROVED CHANNEL MOBILITY

BACKGROUND

1. Field of the Disclosure

Generally, the present disclosure relates to highly sophisticated integrated circuits, including transistors having three-dimensional channel architecture, such as FinFETs, and to a manufacturing method thereof capable of improving the electrical characteristics of the transistor.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically includes so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel, i.e., the drive current capability of the conductive channel, is controlled by a gate electrode formed adjacent to the channel and separated therefrom by a thin insulating layer. The conductivity of the channel, upon formation of a conductive channel due to the application of an appropriate control voltage to the gate electrode, depends on, among other things, the dopant concentration, the mobility of the charge carriers and, for a planar transistor architecture, the distance between the source and drain, which is also referred to as channel length.

In view of further device scaling based on well-established materials, new transistor configurations have been proposed in which a "three-dimensional" architecture is provided in an attempt to obtain a desired channel width, while at the same time superior controllability of the current flow through the channel is preserved. To this end, so-called FinFETs have been proposed in which a thin sliver or fin of silicon is formed in a thin active layer of an SOI (silicon-on-insulator) or a standard silicon substrate, wherein, on both sidewalls and, if desired, on a top surface, a gate dielectric material and a gate electrode material are provided, thereby realizing a multiple gate transistor whose channel may be fully depleted.

In some conventional approaches for forming FinFETs, the fins are formed as elongated device features followed by the deposition of the gate electrode materials, possibly in combination with any spacers, and thereafter the end portions of the fins may be "merged" by epitaxially growing a source or drain material. In particular, several FinFETs can be connected in parallel in this manner, in order to increase the total drive current. Usually then, in order to realize such parallel connection, the individual FinFETs use the same source and/or drain region.

This, however, has a negative effect on the electrical performances of the FinFET transistors. Among various problems, such an approach with a common source and drain for all FinFETs increases parasitic capacitances between the source and the gate, as well as between the drain and the gate, and it limits the stress type and amount thereof that can be obtained on each of the FinFETs.

In view of the situation described above, the present disclosure relates to semiconductor devices and manufacturing techniques in which FinFETs, or generally three-dimensional transistors, may be formed and potentially connected in parallel to each other while avoiding or at least reducing the effect of one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

The present disclosure is generally directed to semiconductor devices wherein FinFET devices, or generally three-dimensional transistors, may be formed utilizing a common drain and/or source region for a plurality of devices, and subsequently etching the drain and/or source region so as to remove at least part of the drain and/or source region positioned between the FET fins, or channels. Alternatively, the drain and/or source regions can be formed with such a mask so as to obtain the same geometry, namely, by having less material from the drain and/or source region in between the FET fins than on the fins themselves. This provides the advantage that the surface area of the drain and/or source region facing the gate is reduced, due to the removal, or the absence during the deposition, of the drain and/or source material, thus reducing the amount of parasitic capacitance between the drain region and the gate and/or between the source region and the gate. Further, by limiting the amount of material of the drain and/or source region in between the channels, structural stress caused by the presence of the drain and/or source material can be controlled differently with respect to the case where the drain and/or source material is present between the various fins. Even further, since more space between the fins is left available due to the at least partial absence of the drain and/or source material, it is possible to further deposit a different material, allowing a further degree of control of the stress of the fins.

In one illustrative embodiment, a semiconductor device is disclosed that includes a plurality of spaced apart fins, wherein each of the plurality of spaced apart fins includes a semiconductor material. Furthermore, the disclosed semiconductor device includes a dielectric material layer that is positioned between each of the plurality of spaced apart fins, and a common gate structure that is positioned above the dielectric material layer and extends across each of the plurality of spaced apart fins. Additionally, the device further includes, among other things, a continuous merged semiconductor material region positioned on each of the plurality of spaced apart fins and above the dielectric material layer, wherein the continuous merged semiconductor material region is laterally spaced apart from the common gate structure and extends between and physically contacts each of the plurality of spaced apart fins. The continuous merged semiconductor material region also has a first sidewall surface that faces toward the common gate structure and a second sidewall surface that is opposite of the first sidewall surface and faces away from the common gate structure. Moreover, a stress-inducing material is positioned in a space that is defined by at least the first sidewall surface of the continuous merged semiconductor material region, opposing sidewall surfaces of an adjacent pair of the plurality of spaced apart fins, and an upper surface of the dielectric material layer.

Another exemplary embodiment is directed to a semiconductor device that includes, among other things, a plurality of spaced apart fins, each of the plurality of spaced apart fins including a semiconductor material. Additionally, the semiconductor device further includes a dielectric material layer that is positioned between each of the plurality of spaced apart fins, and a common gate structure that is positioned above the dielectric material layer and extends across each of the plurality of spaced apart fins. Furthermore, the illustrative device also includes a continuous merged semiconductor material region that is positioned on each of the plurality of spaced apart fins and above the dielectric material layer, wherein the continuous merged semiconductor material region is laterally spaced apart from the common gate structure and extends between and physically contacts each of the plurality of spaced apart fins. Moreover, the continuous merged semiconductor material region has a first sidewall surface that faces toward the common gate structure and a second sidewall surface that is opposite of the first sidewall surface and faces away from the common gate structure. Additionally, the first sidewall surface of the continuous merged semiconductor material region, a first portion of opposing sidewall surfaces of an adjacent pair of the plurality of spaced apart fins, and a first portion of an upper surface of the dielectric material layer at least partially define a first space between the continuous merged semiconductor material region and the common gate structure, and the second sidewall surface of the continuous merged semiconductor material region, a second portion of the opposing sidewall surfaces of the adjacent pair of the plurality of spaced apart fins, and a second portion of the upper surface of the dielectric material layer at least partially define a second space on an opposite side of the continuous merged semiconductor material region from the first space.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it will be apparent that the embodiments of the disclosure may be practiced without the specific details. In order to avoid obscuring the present disclosure, some well-known circuits, system configurations, structure configurations and process steps are not disclosed in detail.

Generally, the present disclosure contemplates manufacturing techniques and semiconductor devices in which a non-planar transistor configuration, also referred to as a three-dimensional transistor or, more specifically, a FinFET, may be provided on the basis of a process strategy in which initial fins formed from semiconductor-based materials, such as silicon, may be used.

Figure 1A:
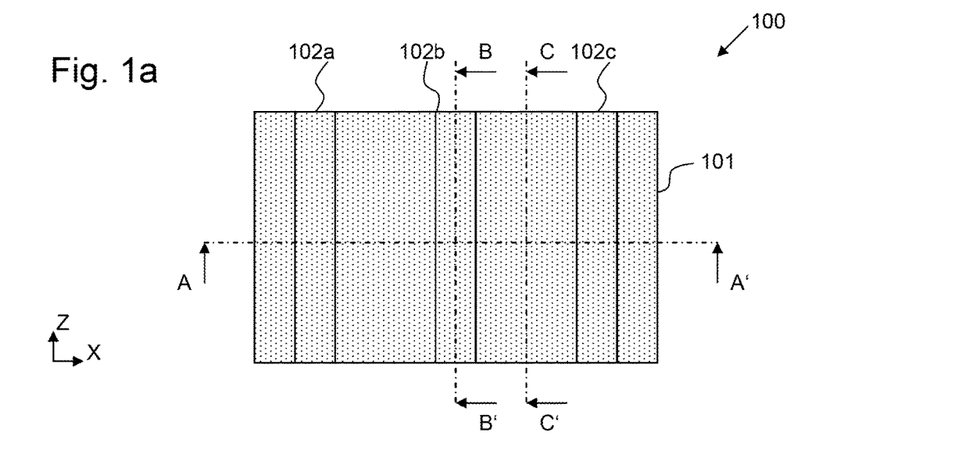
FIG. 1a schematically illustrates a top view of a semiconductor structure according to illustrative embodiments.
Figure 1B:
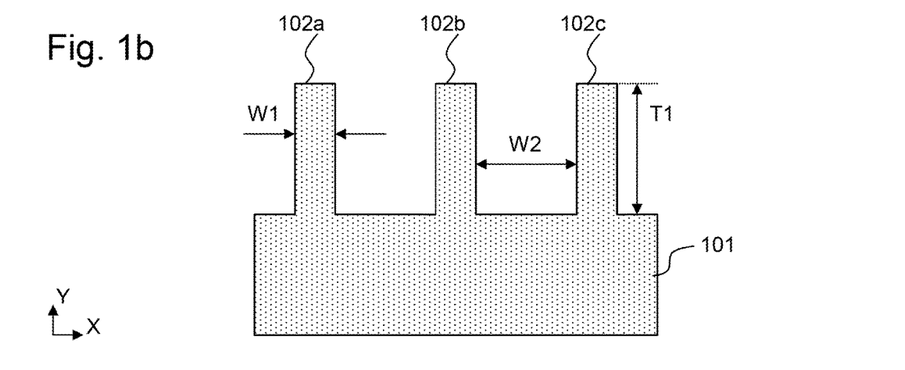
FIG. 1b schematically illustrates a cross-sectional view along section A-A' of FIG. 1a, according to illustrative embodiments.
Figure 1C:
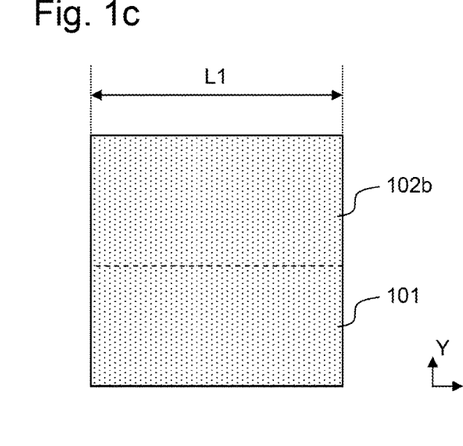
FIG. 1c schematically illustrates a cross-sectional view along a section B-B' of FIG. 1a, according to illustrative embodiments.
Figure 1D:
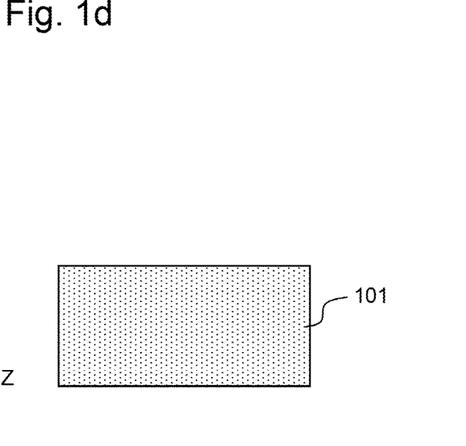
FIG. 1d schematically illustrates a cross-sectional view along a section C-C' of FIG. 1a, according to illustrative embodiments.
Figure 2A:
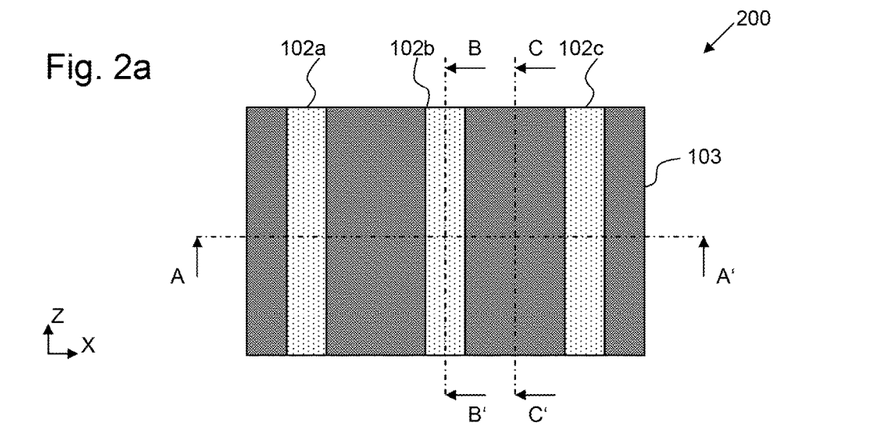
FIG. 2a schematically illustrates a top view of the semiconductor structure of FIG. 1a in another manufacturing stage, according to illustrative embodiments.
Figure 2B:
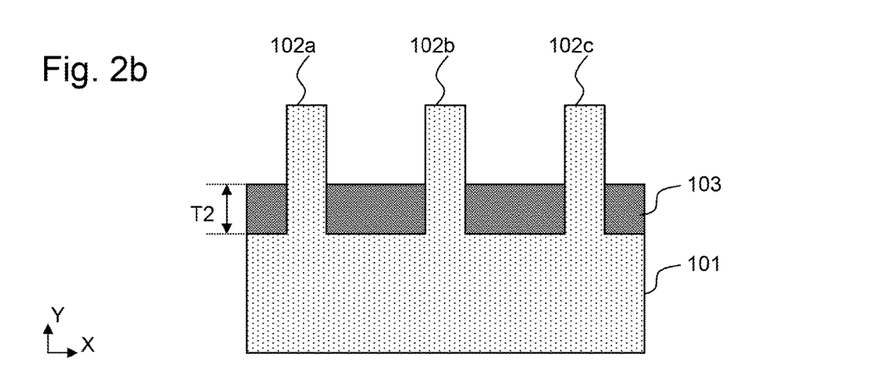
FIG. 2b schematically illustrates a cross-sectional view along section A-A' of FIG. 2a, according to illustrative embodiments.
Figure 2C:
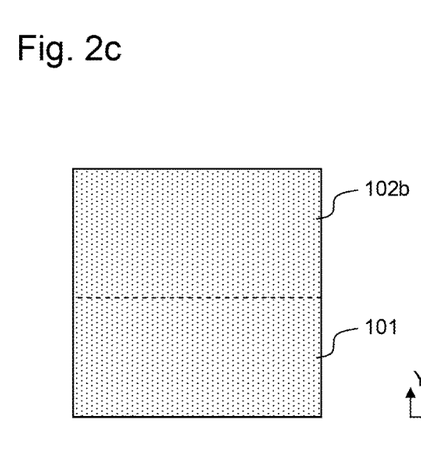
FIG. 2c schematically illustrates a cross-sectional view along a section B-B' of FIG. 2a, according to illustrative embodiments.
Figure 2D:
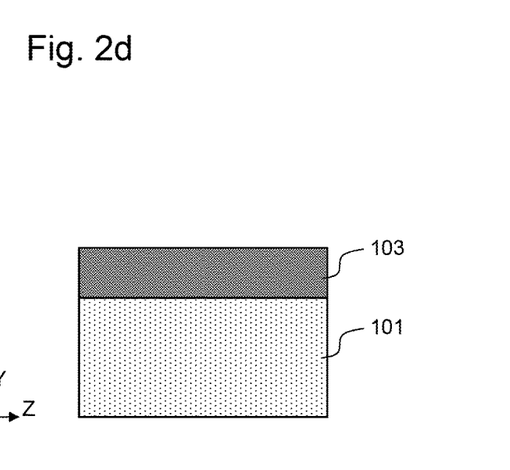
FIG. 2d schematically illustrates a cross-sectional view along a section C-C' of FIG. 2a, according to illustrative embodiments.

FIG. 1a schematically illustrates a top view of a semiconductor structure 100. FIGS. 1b, 1c and 1d schematically illustrate cross-sectional views of the semiconductor structure 100 taken along lines A-A', B-B' and C-C', respectively.

As can be seen in the figures, the semiconductor structure 100 includes a substrate 101 in which fins 102a-102c are provided. At least part of the fins 102a-102c acts as a channel for the respective FinFET, as will be described in more detail later. The fins 102a-102c may be realized by etching material from the substrate 101, so as to expose the fins 102a-102c, or by a deposition of material onto the substrate 101 so as to build the fins 102a-102c. Still alternatively, they could be realized by a sidewall image transfer method. In all cases, the resulting structure is the one illustrated in FIGS. 1a-1d. The material of the substrate 101 may silicon or any other suitable semiconductor material based on the specific device requiremenst, such as germanium (Ge), silicon/germanium (SiGe) or a layered semiconductor structure, such as a silicon-on-insulator (SOI), or a semiconductor alloy, such as a III-V alloy. The fins 102a-102c may be realized from the same semiconductor material of the substrate 101, in particular when obtained by removing material from the substrate 101, but also when realized by deposition of material on the substrate 101, for instance, when using a silicon epitaxial growth on a silicon substrate. Alternatively, the fins 102a-102c may be realized by a different semiconductor material. In both cases, the fins 102a-102c may be doped differently with respect to the substrate 101.

As can be seen in FIG. 1b, the fins 102a-102c extend in a vertical Y direction, preferably with a height T1 included in the range of 60-90 nm, even more preferably with a value of 70 nm. Furthermore, each of the fins 102a-102c has a width W1 in the X direction, preferably in the range of 20-40 nm, even more preferably with a value of 25 nm. Finally, as can be seen in FIG. 1c, the fin 102b, as well as fins 102a and 102c (not illustrated in FIG. 1c), have a length L1 in the Z direction, preferably in the range of 50-80 nm, even more preferably with a value of 60 nm. Also, the fins 102a-102c may be placed at a distance W2 from each other, in the X direction, in the range from 20-40 nm, preferably 35 nm.

Each of the fins 102a-102c may sustain a maximum flow of current, which is limited by the materials and the dimensions used. For some applications, a level of current higher than the one sustainable by a single FinFET may be needed. In those cases, the fins 102a-102c may be connected in parallel by realizing a common source region and/or a common drain region for at least two of the fins 102a-102c, in order to increase the total current flowing between the common source region and/or the common drain region. The realization of such common drain and/or source region will be described in the following description, in particular with reference to FIGS. 4a-4d.

FIGS. 2a-2d schematically illustrate a semiconductor structure 200, resulting from the semiconductor structure 100 following a further manufacturing step. In particular, FIGS. 2a-2d schematically illustrate the semiconductor structure from the same viewpoints of FIGS. 1a-1d, respectively.

As can be seen in FIGS. 2a-2d, the semiconductor structure 200 is obtained from the semiconductor structure 100 by a deposition of an insulating layer 103. Preferably, in some embodiments, the insulating layer 103 may be deposited with a thickness in the Y direction of 100 nm. Subsequently, the insulating layer 103 may be thinned down with a chemical mechanical polishing (CMP) step, to roughly the height value corresponding to the top surface of the fins 102a-102c. Finally, the insulating layer 103 may be anisotropically etched so as to leave a layer of insulating material with a thickness T2 of, preferably, 50 nm, at the bottom of the fins 102a-102c. In other words, in some embodiments, the insulating layer 103 has a height which is smaller than the height of the fins 102a-102c.

Although the above process steps have been provided so as to illustrate one exemplary embodiment for realizing the insulating layer 103, it will be clear to those skilled in the art that the insulating layer 103 may be realized within the fins 102a-102c with alternative process steps. For instance, the insulating layer 103 could be deposited only within the space between the fins 102a-102c, by use of the appropriate mask and deposition steps, so as to achieve the required thickness in a single deposition step, without the use of any CMP and/or etching.

FIGS. 3a-3d schematically illustrate a semiconductor structure 300, resulting from the semiconductor structure 200 following a further manufacturing step. In particular, FIGS. 3a-3d schematically illustrate the semiconductor structure from the same viewpoints of FIGS. 1a-1d, respectively.

Figure 3A:
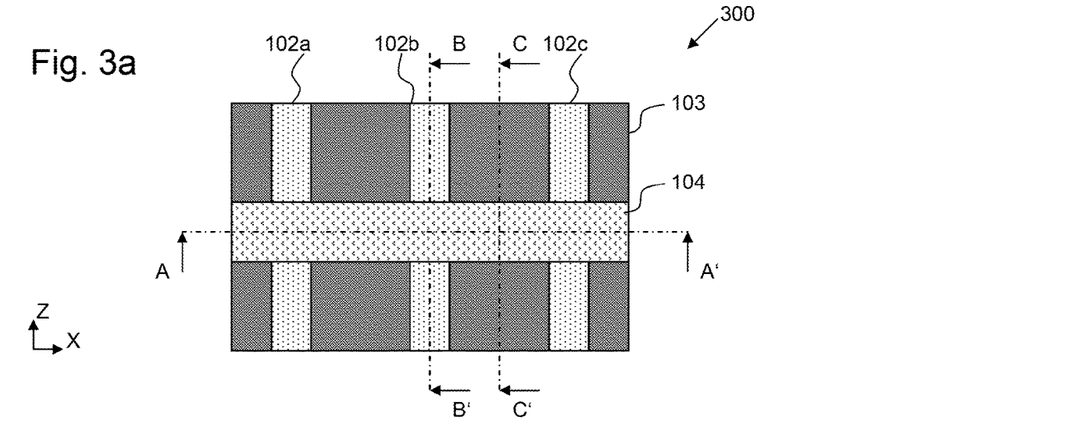
FIG. 3a schematically illustrates a top view of the semiconductor structure of FIG. 1a in another manufacturing stage, according to illustrative embodiments.

As can be seen in FIG. 3a, a dummy gate 104 is realized on the semiconductor structure 200, thereby resulting in the semiconductor structure 300. Although a dummy gate is here described, thereby signifying that in subsequent processes, not illustrated, a gate will replace the dummy gate, the present invention is not limited thereto. In particular, in some embodiments, the gate 104 may be the final gate and not a dummy gate. Thus, in describing the present invention, the term "dummy gate 104" and "gate 104" may be used interchangeably.

Figure 3B:
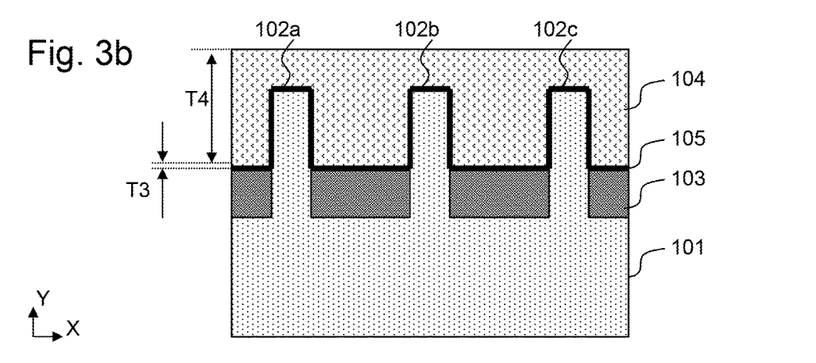
FIG. 3b schematically illustrates a cross-sectional view along section A-A' of FIG. 3a, according to illustrative embodiments.
Figure 3C:
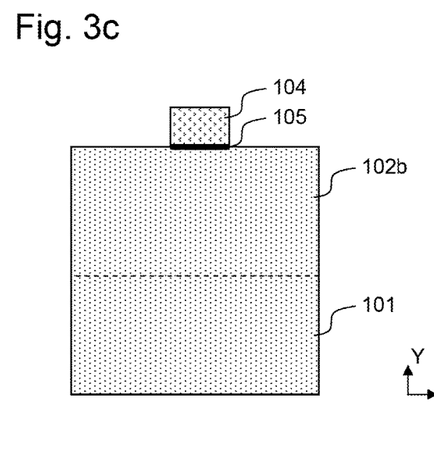
FIG. 3c schematically illustrates a cross-sectional view along a section B-B' of FIG. 3a, according to illustrative embodiments.
Figure 3D:
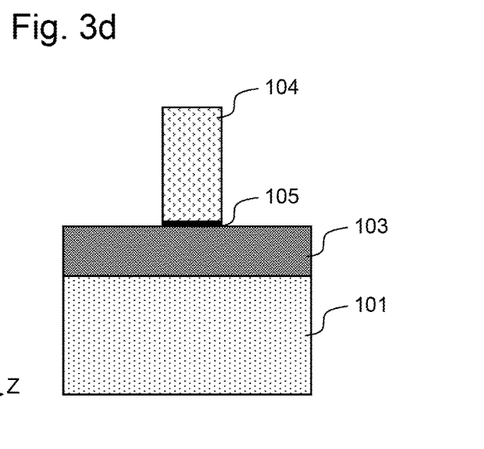
FIG. 3d schematically illustrates a cross-sectional view along a section C-C' of FIG. 3a, according to illustrative embodiments.

In particular, the dummy gate 104 may be realized, for instance, by polysilicon. Preferably, the dummy gate 104 has a width along direction Z, corresponding to the channel length of the FinFETs in the range of 20-30 nm, even more preferably with the value of 26 nm. In other words, the part of the fins 102a-102c under the dummy gate 104 corresponds to the channel of the respective FinFET. The dummy gate 104 is separated by each of the fins 102a-102c by a gate dielectric 105, as can be seen in FIGS. 3b-3d. The gate dielectric 105 is typically an oxide, such as a silicon oxide, preferably having a thickness of 2-3 nm. The gate dielectric 105 may be obtained, for instance, by a chemical vapor deposition or by any other technique allowing the realization of a thin layer on the fins 102a-102c. The dummy gate 104 may be obtained by a deposition of the material realizing the dummy gate 104, followed by a subsequent planarization via a CMP step.

Although not illustrated in the figures, a nitride layer may be realized on top of the dummy gate 104, and/or parts of the fins where the source and drain do not need to be realized, and/or of the insulating layer. The purpose of such a nitride layer is to act as a spacer during the subsequent growth of the source and drain regions 108 and 109 (FIGS. 4a-4d). In this respect, it will be clear to those skilled in the art that such a spacing layer is not necessarily made of nitride, but that any material allowing the subsequent realization of the source and drain in a localized manner may be employed.

FIGS. 4a-4d schematically illustrate a semiconductor structure 400, resulting from the semiconductor structure 300 following a further manufacturing step. In particular, FIGS. 4a-4d schematically illustrate the semiconductor structure from the same viewpoints of FIGS. 1a-1d, respectively.

More specifically, in the semiconductor structure 400, the source and drain regions 108 and 109 are realized on the two ends of each of the fins 102a-102c. By using the previously mentioned nitride layer, or any equivalent masking layer, the positioning of the source and drain regions 108 and 109 may be precisely controlled. In particular, the shape of the source and drain regions 108 and 109 corresponds to the negative image of the nitride, or masking, layer mentioned with reference to FIGS. 3a-3d and not illustrated.

The realization of the source region 108 and the drain region 109 may be done, in some embodiments, by using an epitaxial growth of silicon to merge the fins at their end in the regions 108 and 109, namely, in those regions not covered by the masking or nitride (SiN) layer. Thanks to the nitride or masking layer, the proximity of the source and drain regions 108 and 109 to the dummy gate 104 may be precisely controlled. In an exemplary manufacturing method, the gate 104 is completely encapsulated with nitride and only the future region of the source and drain 108 and 109 are open by a lithography step followed by a corresponding etching step so that selective silicon is grown in those regions. Although the source and drain regions 108 and 109 are here described as being the result of a silicon epitaxial growth, the present invention is not limited thereto and other materials, such as SiGe or III-V alloys, and/or other deposition methods, such as a chemical vapor deposition (CVD) or physical vapor deposition (PVD), may be employed instead. The source and drain regions 108 and 109 may then be subsequently doped, if necessary, for instance by using boron for P-type FETs and P/As for N-type FETs. The source and drain regions 108 and 109 may be placed at a distance W3, in the Z direction, in the range of 10-30 nm, preferably 20 nm, from the gate 104. Additionally, they may have a width W4, in the Z direction, in the range of 20-40 nm, preferably 30 nm.

Following the realization of the source and drain regions 108 and 109, the fins 102a-102c are thus electrically connected in parallel. To access the source and drain regions 108 and 109, corresponding source and drain contacts (not illustrated) may be realized on the source and drain regions. However, such a construction provides a rather wide area of the source and drain regions 108 and 109, on the XY plane, facing the gate 104. This creates a rather high parasitic capacitance between the source region 108 and the gate 104, as well as between the drain region 109 and the gate 104. Additionally, the material of the source and drain regions 108 and 109 may present a bi-axial stress, due to the growing technique employed for those regions. This may limit the amount of current that can flow through the fins 102a-102c, and/or through the source and drain regions 108 and 109.

FIGS. 5a-5d schematically illustrate a semiconductor structure 500, corresponding to the semiconductor structure 400 with an overlapping mask 107. In particular, FIGS. 5a-5d schematically illustrate the semiconductor structure from the same viewpoints of FIGS. 1a-1d, respectively.

Figure 5A:
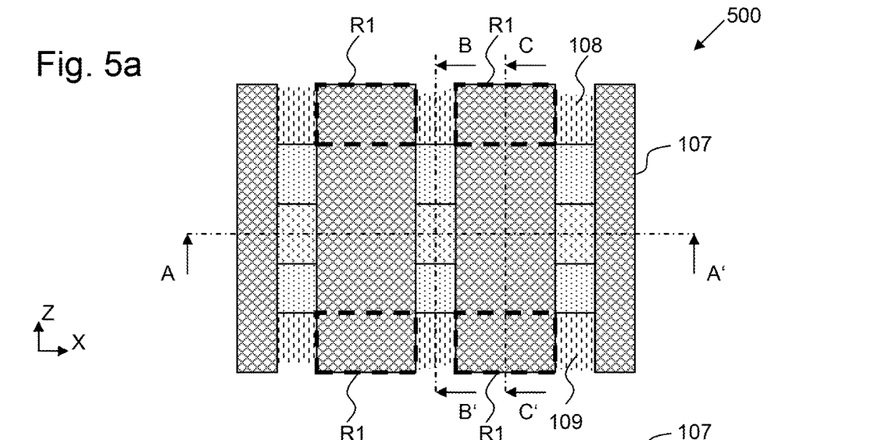
FIG. 5a schematically illustrates a top view of the semiconductor structure of FIG. 1a in another manufacturing stage, according to illustrative embodiments.
Figure 5B:
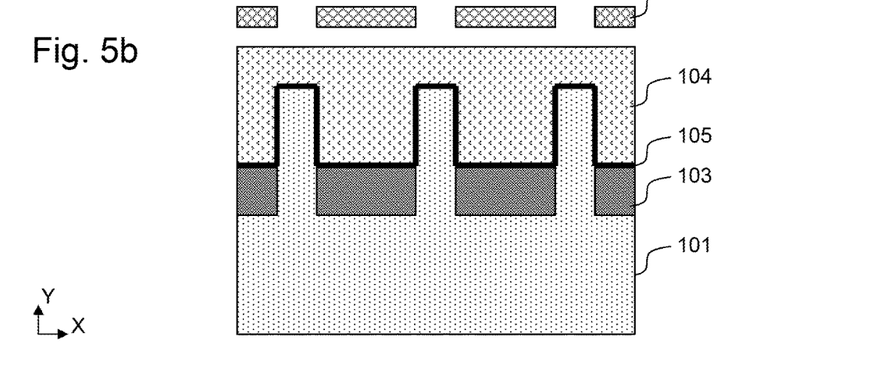
FIG. 5b schematically illustrates a cross-sectional view along section A-A' of FIG. 5a, according to illustrative embodiments.
Figure 5C:
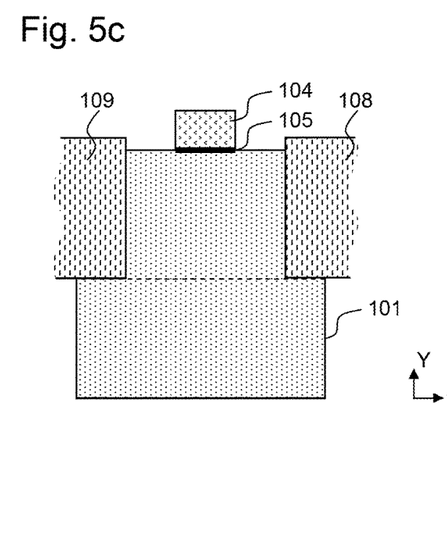
FIG. 5c schematically illustrates a cross-sectional view along a section B-B' of FIG. 5a, according to illustrative embodiments.
Figure 5D:
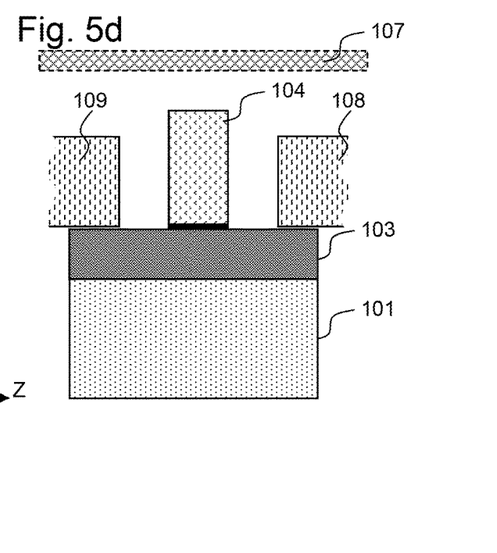
FIG. 5d schematically illustrates a cross-sectional view along a section C-C' of FIG. 5a, according to illustrative embodiments.

More specifically, in FIG. 5a, a mask 107 is illustrated as vertically overlapping the semiconductor structure 500. Here, for a reduction in the number of masks and thereby in the manufacturing costs, the mask 107 may correspond to the mask (not illustrated) already used for the realization of the fins 102a-102c. Here, even if the mask 107 is positioned with a tolerance of 5-10 nm with respect to its original placement for realizing the fins 102a-102c, the removing step may still be carried out successfully. However, any mask that allows the removal of at least part of the material of the source and drain regions 108 and 109 in at least part of the region R1 separating the fins 102a-102c from each other may be used instead. Thanks to the use of the mask 107, selective removal of the material used for the source and drain regions 108 and 109 in the regions R1 between the fins 102a-102c is achieved. The area between the gate 104 and the source and drain regions 108 and 109 may, at this stage, be still protected by the silicon nitride or, more generally, the masking layer from the spacer, used in the previous manufacturing step, so that material of the source and drain regions 108 and 109 may be selectively removed in the portion between the fins 102a-102c, without affecting the rest of the structure.

FIGS. 6a-6d schematically illustrate a semiconductor structure 600, corresponding to the semiconductor structure 400 after the etching process based on the mask 107 has been carried out. In particular, FIGS. 6a-6d schematically illustrate the semiconductor structure from the same viewpoints of FIGS. 1a-1d, respectively.

Figure 6A:
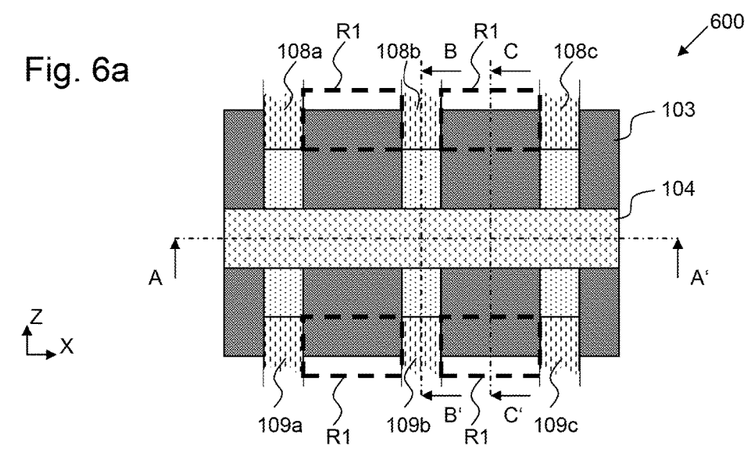
FIG. 6a schematically illustrates a top view of the semiconductor structure of FIG. 1a in another manufacturing stage, according to illustrative embodiments.
Figure 6B:
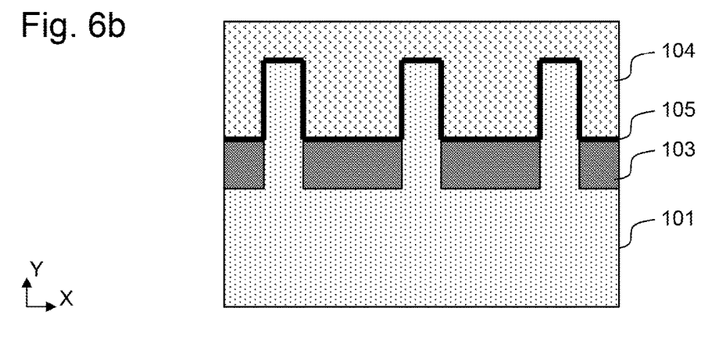
FIG. 6b schematically illustrates a cross-sectional view along section A-A' of FIG. 6a, according to illustrative embodiments.
Figure 6C:
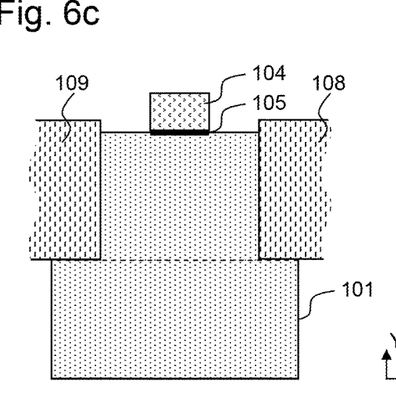
FIG. 6c schematically illustrates a cross-sectional view along a section B-B' of FIG. 6a, according to illustrative embodiments.
Figure 6D:
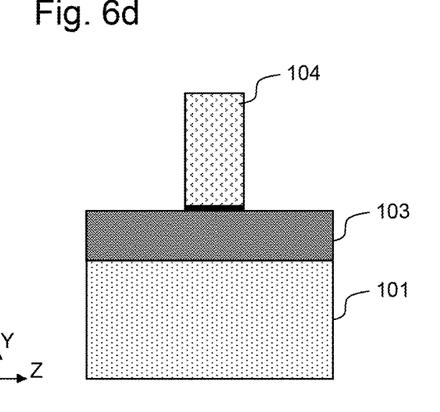
FIG. 6d schematically illustrates a cross-sectional view along a section C-C' of FIG. 6a, according to illustrative embodiments.

Thanks to the removal of the material of the source and drain regions 108 and 109 in regions R1 between the fins 102a-102c, the semiconductor structure 600 as illustrated in FIGS. 6a-6d may be obtained. In particular, as can be seen in FIG. 6a, the regions R1 placed between the fins 102a-102c, aligned with the source and drain regions 108 and 109 in the X direction, do not contain material connecting the sources and drains 108 and 109 to each other. Rather, the source and drain regions 108 and 109 are each independently separated for each fin 102a-102c, thus resulting in independent sources 108a-108c and independent drains 109a-109c.

It should be noted that, in the present embodiment, the mask 107 has been illustrated as covering the entire illustrated source and drain regions 108 and 109 in the Z direction. However, the present invention is not limited thereto. In particular, the source and drain material between the fins 102a-102c may be completely removed, as illustrated in FIGS. 6a-6d so as to leave each fin with an independent source 108a-108c and drain 109a-109c. Those independent sources and drains may then be electrically connected via their respective contacts and the appropriate use of vias and connection lines.

Figure 7A:
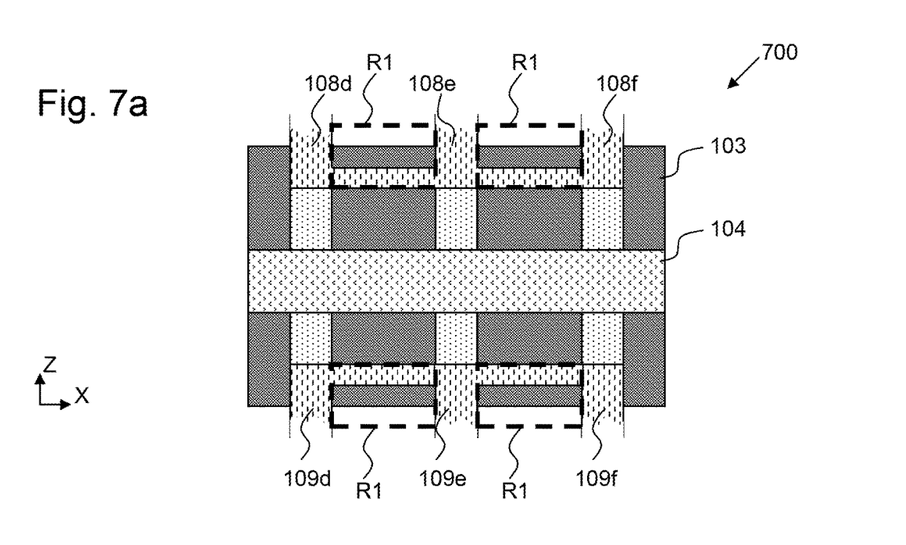
FIG. 7a schematically illustrates a top view of a semiconductor structure, according to illustrative embodiments.
Figure 7B:
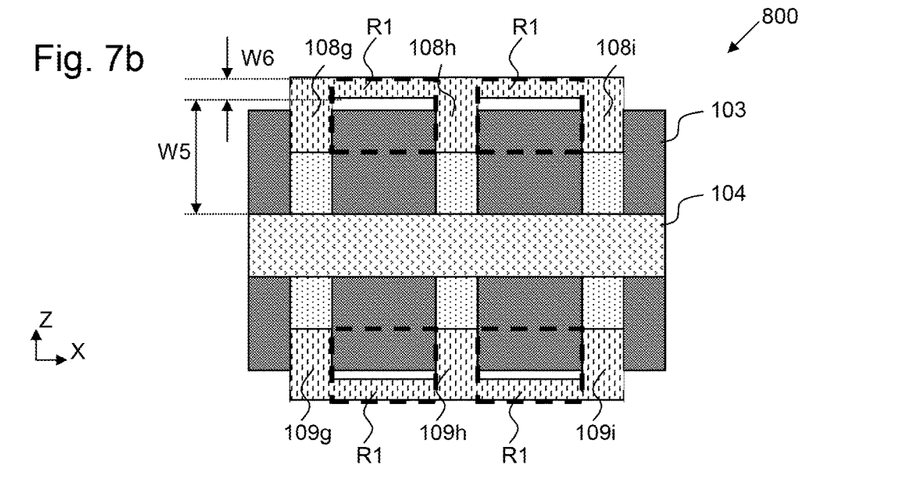
FIG. 7b schematically illustrates a top view of a semiconductor structure, according to illustrative embodiments.

Alternatively, only a portion of the source and drain material may be removed from between the fins 102a-102c, in particular the portion closest, in the Z direction, to the dummy gate 104, as illustrated in FIG. 7b by the semiconductor structure 800. Here, material of the drain and source regions 108 and 109 may be left between the fins 102a-102c at a position further away, in the Z direction, from the dummy gate 104 than the source and drain 108g-108i and 109g-109i on the fins 102a-102c. In particular, the remaining material of the source and drain regions 108 and 109 may start at a distance W5, in the Z direction, in the range of 20-30 nm, preferably 25 nm. Thanks to the latter approach, connection between the sources and drains 108g-108i and 109g-109i of the fins 102a-102c may be ensured by means of the remaining material of the source and drain regions 108 and 109 in between the fins 102a-102c.

Still alternatively. only a portion of the source and drain material may be removed from between the fins 102a-102c, in particular the portion further away, in the Z direction, from the dummy gate 104, as illustrated in FIG. 7a by the semiconductor structure 700. Here, material of the drain and source regions 108 and 109 may be left between the fins 102a-102c at a position as close as, in the Z direction, the dummy gate 104 than the sources and drains 108d-108f and 109d-109f on the fins 102a-102c. Thanks to this approach, connection between the sources and drains 108d-108f and 109d-109f of the fins 102a-102c may be ensured by means of the remaining material of the source and drain regions 108 and 109 in between the fins 102a-102c.

The embodiments illustrated by semiconductor structures 700 and 800, could, for instance, be employed in order to increase the mechanical strength of the fins 102a-102c.

Both in the semiconductor structure 700 and 800, the width, in the Z direction, of the remaining source and drain material may have a width W6, in the Z direction, in the range of 10-20 nm, preferably 15 nm.

Thus, thanks to the described process, a semiconductor structure may include at least a first and a second three-dimensional transistor, the first transistor and the second transistor being electrically connected in parallel to each other and sharing a common gate 104, may be obtained, in which each transistor has a source region and a drain region, wherein the source and/or drain regions of the first transistor may be at least partially separated from, respectively, the source 108a-108i and/or drain 109a-109i of the second transistor. Even more specifically, each of the first and second transistors may include a channel, and the source and/or drain of the first transistor are at least partially separated from, respectively, the source and/or drain of the second transistor along a direction parallel to the channel of the first transistor and/or the channel of the second transistor. Further, the sources 108a-108c, 108g-108i and/or drains 109a-109c, 109g-109i of the first transistor are at least partially separated from, respectively, the sources 108a-108c, 108g-108i and/or drains 109a-109c, 109g-109i of the second transistor in the part of the source and/or drain closest to gate 104. Alternatively, the sources 108d-108f and/or drains 109a-109f of the first transistor are at least partially separated from, respectively, the sources 108d-108f and/or drains 109a-109f of the second transistor in the part of the source and/or drain furthest from the gate 104. Still alternatively, the sources 108a-108c and/or drains 109a-109c of the first transistor are completely separated from, respectively, the sources 108a-108c and/or drains 109a-109c of the second transistor. In such embodiments, each transistor further includes a channel, and the source and/or drain of the first transistor have a width W1 corresponding to a channel's width of the first transistor, and/or the source and/or drain of the second transistor have a width W1 corresponding to a channel's width of the second transistor. Here, the expression partially separated is intended to mean that the two elements are not completely connected along their sides facing each other, but only a part of the side facing each other is employed for the connection to the other element.

More generally, the present invention may be implemented by either completely removing the material in regions R1, as illustrated in the semiconductor structure 600, or by removing only part of it, as illustrated in the semiconductor structures 700 and 800. It will be clear to those skilled in the art that the semiconductor structures 700 and 800 are only two extreme situations of the same configuration in which some material of the source and drain regions 108 and 109 is left in the regions R1, and that configurations in between those two may be implemented.

Figure 4A:
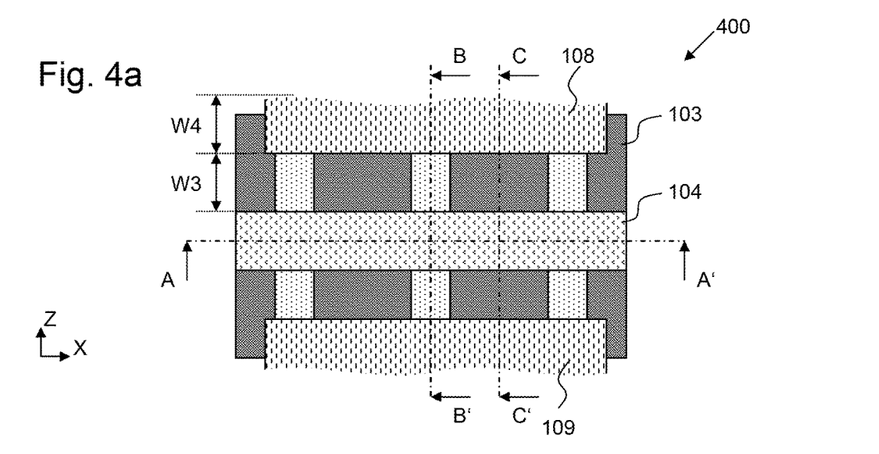
FIG. 4a schematically illustrates a top view of the semiconductor structure of FIG. 1a in another manufacturing stage, according to illustrative embodiments.
Figure 4B:
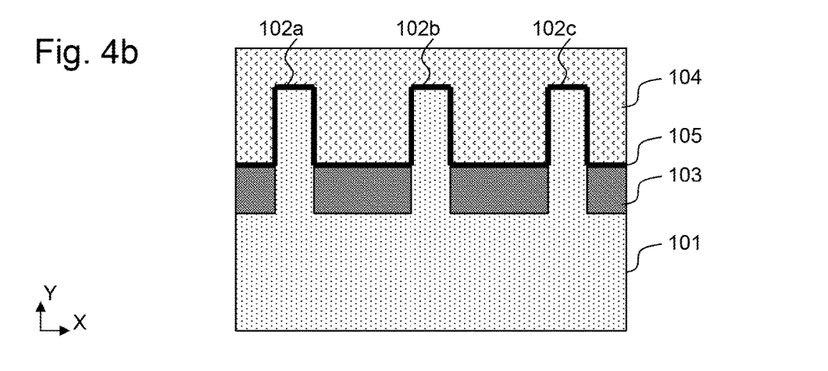
FIG. 4b schematically illustrates a cross-sectional view along section A-A' of FIG. 4a, according to illustrative embodiments.
Figure 4C:
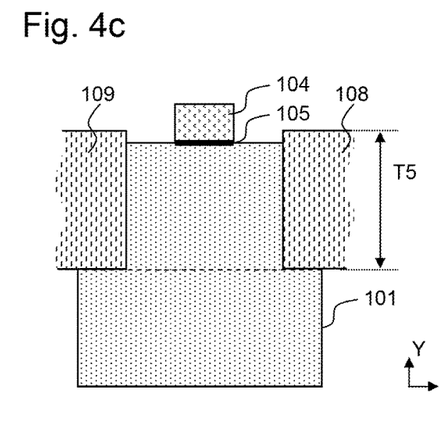
FIG. 4c schematically illustrates a cross-sectional view along a section B-B' of FIG. 4a, according to illustrative embodiments.
Figure 4D:
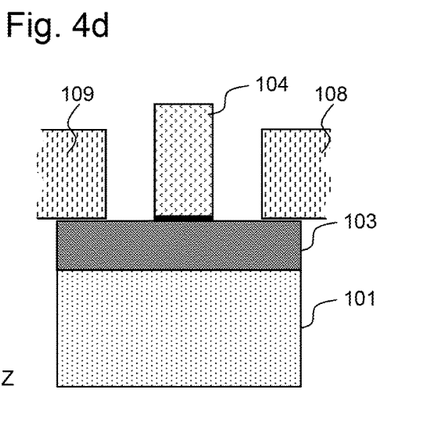
FIG. 4d schematically illustrates a cross-sectional view along a section C-C' of FIG. 4a, according to illustrative embodiments.

Thus, semiconductor structures 600-800 differ from semiconductor structure 400 due to the removal of at least part of the drain and source material between the fins 102a-102c, namely in the regions R1. In particular, in the semiconductor structures 600 and 800, due to the removal of such material in the proximity of the dummy gate 104, it is possible to reduce the capacitance between the dummy gate 104 and the source and drain regions 108 and 109. In fact, as can be seen when comparing the semiconductor structure 600 and 800 with the semiconductor structure 400, the area on the XY plane of the sources and drains 108a-108c and 109a-109c of the semiconductor structure 600 is substantially smaller than the equivalent area for the semiconductor structure 400. Even in the case of the semiconductor structure 800, where only some of the material forming the source and drain regions 108 and 109 is removed from between the fins 102a-102c, while the area on the XY plane of the source and drain regions 108 and 109 of the semiconductor structure 800 and 400 is the same, the average distance of such area from the gate 104 is higher for the semiconductor structure 800 than for the semiconductor structure 400. That is, both when only some of the material of the source and drain regions 108 and 109 is removed, or when all of such material is removed, the capacitance between the source and drain regions 108 and 109 and the dummy gate 104 is reduced, thus improving the electrical characteristics of the FinFETs connected in parallel.

Additionally, by removing material in between the fins 102a-102c, it is possible to convert a biaxial stress from the epitaxial growth of the drain and source 108 and 109 material, such as, for instance, silicon/germanium, into uniaxial stress. In some conditions, in fact, the uniaxial stress in FinFETs achieves a better mobility improvement compared to the biaxial stress. Thus, the semiconductor structures 600, 700 and 800 have better electrical characteristics than the semiconductor structure 400, in which the material between the fins 102a-102c creates a biaxial stress on the fins, not present or reduced in the semiconductor structures 600, 700 and 800.

Still further, the space between the independent sources and drains 108a-108c and 109a-109c of neighboring fins 102a-102c in the semiconductor structure 600, created by the complete removal of the source and drain material, as well as the space between sources and drains 108d-108i and 109d-109i of neighboring fins 102a-102c in the semiconductor structures 700 and 800, created by the partial removal of the source and drain material, may be subsequently filled with a different material, such as a stress overlayer film, for instance, silicon-nitride ($Si_3N_4$), silicon-oxide ($SiO_2$), etc., thus enabling a mobility and drive current improvement. That is, thanks to the use of another material, it is possible to further configure the desired stress on the fins 102a-102c and/or on the sources and drains 108a-108i and 109a-109i so as to improve the respective electrical characteristics of the FinFETs based on the fins 102a-102c. Such a further configuration of the stress of the source and drain is not possible in the semiconductor structure 400, where the space R1 between the source and drain regions 108 and 109 of the fins 102a-102c is completely filled by the same source and drain region material.

Although not illustrated, it will be clear to those skilled in the art that some process steps not shown in the figures, such as an RTA for activation and diffusion, and/or a silicide formation, and/or a dummy gate removal and replacement by a high-k/metal gate step, and/or contact formation and BEOL processing as in a conventional FinFET flow have not been illustrated for the sake of clarity.

In alternative embodiments of the present invention, instead of removing the material of the source and drain regions 108 and 109 in between the fins 102a-102c, it is possible to deposit such material only in correspondence with zones illustrated by reference numerals 108a-108i and 109a-109i in the semiconductor structures 600-800. In other words, instead of realizing a deposition of source and drain regions 108 and 109 and a subsequent patterning thereof by means of, for instance, photolithography and etching, it is possible to proceed directly to the localized deposition of sources and drains 108a-108i and 109a-109i in a localized manner. This could be achieved, for instance, by using the mask 700 for the localized deposit of the material of the source and drain regions 108 and 109, in addition to the above-mentioned nitride layer, or more generally a masking layer, covering the dummy gate 104 and acting as a spacer in the Z direction for defining the distance between the source 108 and the dummy gate 104, as well as the distance between the drain 109 and the dummy gate 104. Still in other terms, such localized realization of the sources and drains 108a-108c and 109a-109c could be achieved by using the mask 107 for the deposition step illustrated in FIGS. 4a-4d.

Moreover, although three fins 102a-102c have been illustrated, it will be clear to those skilled in the art that any number of fins higher than two may be used to implement the present invention.

The particular embodiments disclosed above are illustrative only, as the invention may be modified and practiced in different but equivalent manners apparent to those skilled in the art having the benefit of the teachings herein. For example, the method steps set forth above may be performed in a different order. Furthermore, no limitations are intended by the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor structure, comprising:
   a plurality of spaced apart fins, each of said plurality of spaced apart fins comprising a semiconductor material;
   a dielectric material layer positioned between each of said plurality of spaced apart fins;
   a common gate structure positioned above said dielectric material layer and extending across each of said plurality of spaced apart fins;
   a continuous merged semiconductor material region positioned on each of said plurality of spaced apart fins and above said dielectric material layer, wherein said continuous merged semiconductor material region is laterally spaced apart from said common gate structure and extends between and physically contacts each of said plurality of spaced apart fins, said continuous merged semiconductor material region having a first sidewall surface that faces toward said common gate structure and a second sidewall surface that is opposite of said first sidewall surface and faces away from said common gate structure, wherein said first sidewall surface of said continuous merged semiconductor material region, a first portion of opposing sidewall surfaces of an adjacent pair of said plurality of spaced apart fins, and a first portion of an upper surface of said dielectric material layer at least partially define a first space between said continuous merged semiconductor material region and said common gate structure, and wherein said second sidewall surface of said continuous merged semiconductor material region, a second portion of said opposing sidewall surfaces of said adjacent pair of said plurality of spaced apart fins, and a second portion of said upper surface of said dielectric material layer at least partially define a second space on an opposite side of said continuous merged semiconductor material region from said first space; and
   a stress-inducing material positioned in said first space.

2. The semiconductor structure of claim 1, wherein said stress-inducing material is in direct contact with at least said first sidewall surface of said continuous merged semiconductor material region, said opposing sidewall surfaces of said adjacent pair of said plurality of spaced apart fins, and said upper surface of said dielectric material layer.

3. The semiconductor structure of claim 1, wherein said stress-inducing material comprises one of silicon nitride and silicon oxide.

4. The semiconductor structure of claim 1, wherein said continuous merged semiconductor material region comprises an epitaxial silicon/germanium alloy.

5. The semiconductor structure of claim 1, wherein said dielectric material layer covers a lower sidewall surface of each of said plurality of spaced apart fins.

6. The semiconductor structure of claim 1, wherein said continuous merged semiconductor material region is a first continuous merged semiconductor material region positioned on a source region side of said common gate structure, the semiconductor structure further comprising a second continuous merged semiconductor material region positioned on a drain region side of said common gate structure.

7. The semiconductor structure of claim 6, wherein said second continuous merged semiconductor material region is positioned on each of said plurality of spaced apart fins and above said dielectric material layer, wherein said second continuous merged semiconductor material region is laterally spaced apart from said common gate structure and extends between and physically contacts each of said plurality of spaced apart fins, said second continuous merged semiconductor material region having a third sidewall surface that faces toward said common gate structure and a fourth sidewall surface that is opposite of said third sidewall surface and faces away from said common gate structure.

8. The semiconductor structure of claim 7, wherein said stress-inducing material is a first stress-inducing material, the semiconductor structure further comprising a second stress-inducing material positioned in a third space that is at least partially defined by said third sidewall surface of said second continuous merged semiconductor material region, opposing sidewall surfaces of an adjacent pair of said plurality of spaced apart fins, and an upper surface of said dielectric material layer.

9. The semiconductor structure of claim 1, wherein said common gate structure is a replacement gate structure comprising a high-k dielectric material and a metal gate electrode.

10. A semiconductor structure, comprising:
a plurality of spaced apart fins, each of said plurality of spaced apart fins comprising a semiconductor material;
a dielectric material layer positioned between each of said plurality of spaced apart fins;
a common gate structure positioned above said dielectric material layer and extending across each of said plurality of spaced apart fins; and
a continuous merged semiconductor material region positioned on each of said plurality of spaced apart fins and above said dielectric material layer, wherein said continuous merged semiconductor material region is laterally spaced apart from said common gate structure and extends between and physically contacts each of said plurality of spaced apart fins, said continuous merged semiconductor material region having a first sidewall surface that faces toward said common gate structure and a second sidewall surface that is opposite of said first sidewall surface and faces away from said common gate structure, wherein said first sidewall surface of said continuous merged semiconductor material region, a first portion of opposing sidewall surfaces of an adjacent pair of said plurality of spaced apart fins, and a first portion of an upper surface of said dielectric material layer at least partially define a first space between said continuous merged semiconductor material region and said common gate structure, and wherein said second sidewall surface of said continuous merged semiconductor material region, a second portion of said opposing sidewall surfaces of said adjacent pair of said plurality of spaced apart fins, and a second portion of said upper surface of said dielectric material layer at least partially define a second space on an opposite side of said continuous merged semiconductor material region from said first space.

11. The semiconductor structure of claim 10, wherein said continuous merged semiconductor material region comprises an epitaxial silicon/germanium alloy.

12. The semiconductor structure of claim 10, wherein said dielectric material layer covers a lower sidewall surface of each of said plurality of spaced apart fins.

13. The semiconductor structure of claim 10, further comprising a stress-inducing material positioned in at least one of said first and second spaces.

14. The semiconductor structure of claim 13, wherein said stress-inducing material is in direct contact with at least one of said first and second sidewall surfaces of said continuous merged semiconductor material region, said opposing sidewall surfaces of said adjacent pair of said plurality of spaced apart fins, and at least one of said first and second portions of said upper surface of said dielectric material layer.

15. The semiconductor structure of claim 13, wherein said stress-inducing material comprises one of silicon nitride and silicon oxide.

16. The semiconductor structure of claim 13, wherein said continuous merged semiconductor material region is a first continuous merged semiconductor material region positioned on a source region side of said common gate structure, the semiconductor structure further comprising a second continuous merged semiconductor material region positioned on a drain region side of said common gate structure.

17. The semiconductor structure of claim 16, wherein said second continuous merged semiconductor material region is positioned on each of said plurality of spaced apart fins and above said dielectric material layer, wherein said second continuous merged semiconductor material region is laterally spaced apart from said common gate structure and extends between and physically contacts each of said plurality of spaced apart fins, said second continuous merged semiconductor material region having a third sidewall surface that faces toward said common gate structure and a fourth sidewall surface that is opposite of said third sidewall surface and faces away from said common gate structure.

18. The semiconductor structure of claim 17, wherein said third sidewall surface of said second continuous merged semiconductor material region, a third portion of opposing sidewall surfaces of said adjacent pair of said plurality of spaced apart fins, and a third portion of said upper surface of said dielectric material layer at least partially define a third space between said second continuous merged semiconductor material region and said common gate structure, and wherein said fourth sidewall surface of said second continuous merged semiconductor material region, a fourth portion of said opposing sidewall surfaces of said adjacent pair of said plurality of spaced apart fins, and a fourth portion of said upper surface of said dielectric material layer at least partially define a fourth space on an opposite side of said second continuous merged semiconductor material region from said third space.

19. The semiconductor structure of claim 18, wherein said stress-inducing material is a first stress-inducing material, the semiconductor structure further comprising a second stress-inducing material positioned in at least one of said third and fourth spaces.

20. The semiconductor structure of claim 10, wherein said common gate structure is a replacement gate structure comprising a high-k dielectric material and a metal gate electrode.

\* \* \* \* \*